United States Patent
Wu et al.

(10) Patent No.: US 11,348,847 B2
(45) Date of Patent: May 31, 2022

(54) TESTKEY DETECTION CIRCUIT

(71) Applicant: United Microelectronics Corp., Hsinchu (TW)

(72) Inventors: Kun-Yuan Wu, Kaohsiung (TW); Wei-Jen Wang, Tainan (TW); Chien-Fu Chen, Miaoli County (TW); Chen-Hsien Hsu, Hsinchu County (TW); Yuan-Hui Chen, Hsinchu (TW); Ruei-Yau Chen, Pingtung County (TW); Cheng-Tsung Ku, Taichung (TW); Zhi-Hong Huang, Tainan (TW); Cheng-Yang Tsai, Kaohsiung (TW); Yu-Lin Chen, Taichung (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 507 days.

(21) Appl. No.: 16/249,812

(22) Filed: Jan. 16, 2019

(65) Prior Publication Data
US 2020/0194321 A1    Jun. 18, 2020

(30) Foreign Application Priority Data
Dec. 13, 2018 (CN) .......... 201811524365.9

(51) Int. Cl.
*H01L 21/66* (2006.01)
*G01R 31/28* (2006.01)
*H03K 3/03* (2006.01)
*H01L 23/544* (2006.01)

(52) U.S. Cl.
CPC .......... *H01L 22/34* (2013.01); *G01R 31/2831* (2013.01); *H01L 23/544* (2013.01); *H03K 3/0315* (2013.01)

(58) Field of Classification Search
CPC ... H01L 22/34; H01L 23/544; G01R 31/2831; H03K 3/0315
See application file for complete search history.

(56) References Cited

U.S. PATENT DOCUMENTS

| | | | |
|---|---|---|---|
| 5,949,240 | A | 9/1999 | Yeh |
| 6,169,694 | B1 | 1/2001 | Nam et al. |
| 7,205,854 | B2 | 4/2007 | Liu |
| 8,539,009 | B2 | 9/2013 | Aliseychik et al. |
| 2001/0015654 | A1 | 8/2001 | Habersetzer et al. |
| 2009/0144677 | A1 | 6/2009 | Gonzalez et al. |

(Continued)

FOREIGN PATENT DOCUMENTS

| | | |
|---|---|---|
| CN | 102623413 | 8/2012 |
| CN | 108766957 | 11/2018 |

OTHER PUBLICATIONS

"Office Action of China Counterpart Application", dated Dec. 13, 2021, p. 1-p. 6.

*Primary Examiner* — Fernando L Toledo
*Assistant Examiner* — Neil R Prasad
(74) *Attorney, Agent, or Firm* — J.C. Patents

(57) ABSTRACT

The invention provides a testkey detection circuit, including a plurality of oscillators and a driving circuit. Each of the oscillators has an enable terminal, a voltage terminal and an output terminal, wherein the enable terminals are connected to a common enable terminal. The driving circuit receives the output terminals of the oscillators and increases a driving level of a selected one of the output terminals as a frequency output.

9 Claims, 4 Drawing Sheets

(56) References Cited

U.S. PATENT DOCUMENTS

| | | | | |
|---|---|---|---|---|
| 2010/0213986 A1* | 8/2010 | Payne | ............... | H03M 1/002 327/108 |
| 2010/0327936 A1* | 12/2010 | Mosalikanti | ....... | G01R 31/2894 327/291 |
| 2011/0204910 A1* | 8/2011 | Suto | ............... | G01R 31/2815 324/754.01 |
| 2018/0248555 A1* | 8/2018 | Jenkins | ............ | G01R 31/2851 |

* cited by examiner

FIG. 2

RO#1: 1 VCC, 2 EN, 3 VSS, 4 VCC_B, 5 OUT

RO#2: 6 VCC, 7 EN, 8 VSS, 9 VCC_B, 10 OUT

RO#3: 11 VCC, 12 EN, 13 VSS, 14 VCC_B, 15 OUT

RO#4: 16 VCC, 17 EN, 18 VSS, 19 VCC_B, 20 OUT

TESTKEY DETECTION CIRCUIT

CROSS REFERENCE TO RELATED APPLICATION

This application claims the priority benefit of China application serial no. 201811524365.9, filed on Dec. 13, 2018. The entirety of the above-mentioned patent application is hereby incorporated by reference herein and made a part of specification.

BACKGROUND

Field of the Invention

The invention relates to a semiconductor manufacturing technique and more particularly, to a testkey detection circuit used in semiconductor manufacturing.

Description of Related Art

Regarding integrated circuits, different processes of a semiconductor manufacturing technique are used to form different element structures layer by layer on wafers, so as to complete integrated circuit structures. In addition, there are a great amount of identical integrated circuits simultaneously manufactured on the wafers. In order to ensure that the integrated circuits are correctly manufactured as expected by a design, testkeys are provided on the wafers or the integrated circuits and are configured to detect properties of the completed circuit structures during the process of manufacturing. Functions of the testkeys in the semiconductor manufacturing are commonly known and will not be described in detail.

In order to probe test signals generated at the testkeys, a testkey detection circuit is required to extract the test signals for being adaptive processed, thereby obtain signals for being analyzed. The test signals are voltage signals generated at the testkeys. The voltage signals are converted into frequency signals and then are output to a back-end analysis circuit for product analysis.

However, in the semiconductor manufacturing, a batch of the manufacturing may include a great amount of wafers and a great amount of integrated circuit units on the wafers, and a great amount of testkeys have to be configured for detection on different positions, environments, manufacturing qualities, etc. Thus, for satisfying the detection of the testkeys, the hardware cost of a testkey detection circuit and the time cost spent on the detection both become expensive for coping with the detection of the great amount of testkeys.

Regarding the testkey detection, how to reduce the hardware cost of the circuit and the time cost spent on the detection needs consideration and improvement.

SUMMARY

The invention provides a testkey detection circuit, having a detection circuit capable of being shared by a plurality of testkeys to reduce circuit cost. Further, based on the sharing characteristics, the invention may perform a plurality of wafer tests simultaneously to reduce the time cost.

In an embodiment, the invention provides a testkey detection circuit, including a plurality of oscillators and a driving circuit. Each of the oscillators has an enable terminal, a voltage terminal and an output terminal, wherein the enable terminals are connected to a common enable terminal. The driving circuit receives the output terminals of the oscillators and increases a driving level of a selected one of the output terminals as a frequency output.

In an embodiment, the invention further provides a testkey detection circuit, including a plurality of oscillators and a driving circuit. Each of the oscillators has an enable terminal, a voltage terminal and an output terminal, wherein the enable terminals are connected to a common enable terminal. The driving circuit includes a multiplexer, a divider and a buffer. The multiplexer receives a plurality of frequency signals from a plurality of output terminals of the oscillators and outputs a selected one of the frequency signals. The divider decreases a frequency of the selected one of the frequency signals as a frequency-decreased signal. The buffer receives the frequency-decreased signal to increase the driving level as a frequency output.

In an embodiment, in the testkey detection circuit as described, the multiplexer includes a plurality of selection terminals to select the one of the frequency signals.

In an embodiment, in the testkey detection circuit as described, the driving circuit includes a voltage source terminal to receive a voltage source to commonly provide the voltage source to the multiplexer, the divider and the buffer, and the testkey detection circuit is commonly grounded to a ground voltage.

In an embodiment, in the testkey detection circuit as described, the oscillators are ring oscillators.

In an embodiment, in the testkey detection circuit as described, the multiplexer sequentially outputs the frequency signals according to a selection order, so as to sequentially obtain a plurality of the frequency outputs.

In an embodiment, in the testkey detection circuit as described, the oscillators are respectively operated in different conditions.

In an embodiment, in the testkey detection circuit as described, the voltage terminals of the oscillators provide different voltage sources.

In an embodiment, in the testkey detection circuit as described, the voltage terminals of the oscillators respectively probe a plurality of contact pads at different circuit positions in integrated circuits.

In an embodiment, in the testkey detection circuit as described, the oscillators are a plurality of ring oscillators, and the ring oscillators are identical circuits or circuits in which at least one of the ring oscillators is different from the others.

In an embodiment, in the testkey detection circuit as described, the driving circuit includes a single voltage input terminal to provide an operation voltage to the multiplexer, the divider and the buffer.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a schematic configuration diagram of circuit terminals used by the testkey detection circuit depicted in FIG. 1 according to an embodiment of the invention.

DESCRIPTION OF EMBODIMENTS

The invention relates to a manufacturing technique of semiconductor elements, which is directed to a testkey detection circuit used in semiconductor manufacturing.

Testkeys are predetermined test points provided to integrated circuits and configured to test properties of semiconductor structures manufactured by a corresponding circuit. The testkeys may be configured in an ordinary manner, and the invention is not intent to limit configured positions of the testkeys. The testkey detection circuit of the invention obtains signals from the testkeys and pre-processes the signals adaptively to obtain frequency signals used for external analysis.

Generally, a testkey requires a detection circuit, so as to generate a frequency signal corresponding to the testkey. Before the architecture of the testkey detection circuit is introduced by the invention, we may first look into a testkey detection mechanism.

Figure 1:
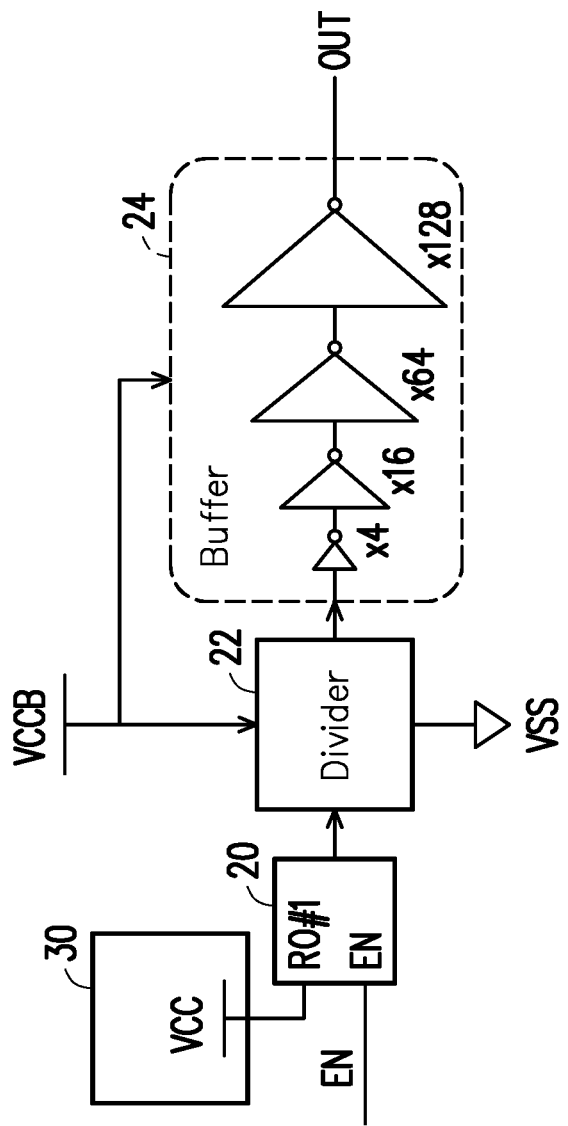
FIG. 1 is a schematic structural diagram of a testkey detection circuit which is looked into by the invention according to an embodiment of the invention.

FIG. 1 is a schematic structural diagram of a testkey detection circuit which is looked into by the invention according to an embodiment of the invention. Referring to FIG. 1, to detect signals of testkeys, a simpler and more direct manner is to provide each testkey with a detection circuit. The detection circuit includes an oscillator 20, and a voltage terminal RO #1 thereof, for example, probes a voltage signal VCC in a testkey configured in an integrated circuit 30. In this case, the integrated circuit 30 is merely an example, and actually, the testkey may be provided at a position to be detected on a wafer, without being limited to any specific position.

An enable terminal EN of the oscillator 20, after receiving an enable signal and being enabled, generates a frequency signal according to the signal of the voltage terminal VCC and outputs the frequency signal. Since a frequency of the frequency signal is substantially large, the frequency of the frequency signal has to be decreased through a divider 22, so as to obtain a frequency-decreased signal. A voltage terminal VCCB of the divider 22 receives a voltage source. The voltage source received by the voltage terminal VCCB is a system voltage source, which is different from the voltage signal VCC received by the voltage terminal RO #1 of the oscillator 20. In addition, a ground voltage terminal VSS provides the entire detection circuit with a ground voltage.

The frequency-decreased signal passing through the buffer 24 may increase a driving level of its signal by, for example, increasing a rising rate at a rising edge, thereby obtaining a square wave that approaches the ideal. The buffer 24 is, for example, formed by a plurality of cascading inverters and increases the rising rate at the rising progressively. Finally, the buffer 24 outputs the frequency-decreased signal from an output terminal OUT for analysis of a back-end application circuit.

Regarding the testkey detection circuit illustrated in FIG. 1, it has a simple one-to-one direct configuration, and for outputs of four testkeys in an ordinary condition for read, the testkey detection circuit includes 20 probes and is capable of detecting four testkeys at a time.

FIG. 2 is a schematic configuration diagram of circuit terminals used by the testkey detection circuit depicted in FIG. 1 according to an embodiment of the invention. Referring to FIG. 2, for the testkey detection circuit illustrated in FIG. 1, a testkey includes 5 probes which are the voltage terminal RO #1, the enable terminal EN, the voltage terminal VSS, the voltage terminal VCCB and the output terminal OUT corresponding to VCC. The 4 testkeys include 20 probe endpoints.

In the invention, after looking into the testkey detection circuit illustrated in FIG. 1, it may be observed that when a test process includes a great amount of wafers and a great amount of testkeys on the wafers to be tested, it generates significant consumption of the time cost, wherein the time cost further includes a mechanical operation time required for dispatching the tested wafers and moving in new wafers to be tested. Further, the testkey detection circuit is capable of detecting only four testkeys at a time. The testkey detection circuit has to be shifted for many times, which is also time-consuming. In the consideration of circuit cost, the oscillator 20, the divider 22 and the buffer 24 has to be configured for each testkey, wherein the divider 22 and the buffer 24 functions similarly and may be further simplified for being shared.

Figure 3:
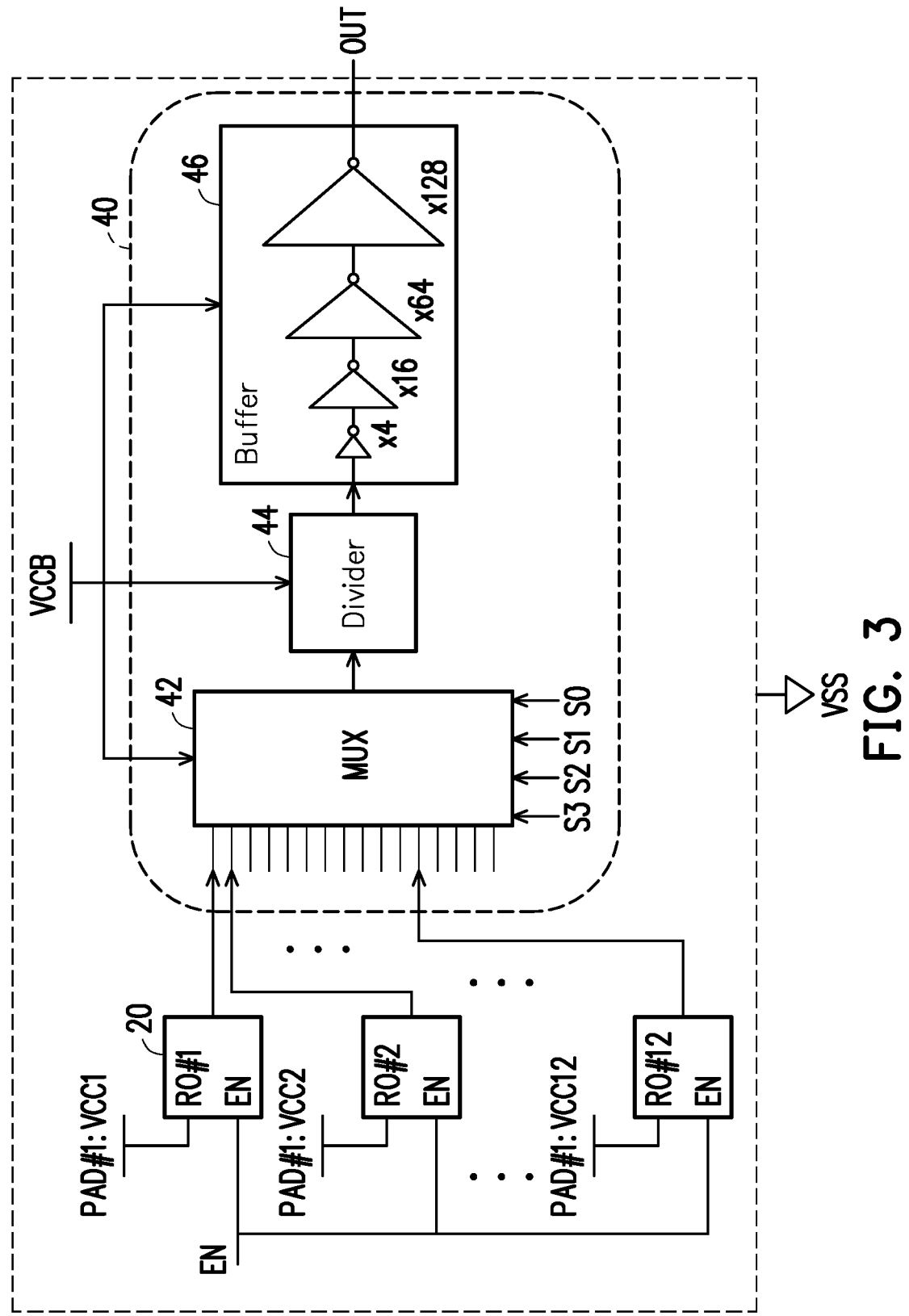
FIG. 3 is a schematic structural diagram of a testkey detection circuit according to an embodiment of the invention.

FIG. 3 is a schematic structural diagram of a testkey detection circuit according to an embodiment of the invention. Referring to FIG. 3, after the testkey detection circuit illustrated in FIG. 1 has been looked into by the invention, a modification of the testkey detection circuit is provided. In the present embodiment, a divider 44 and a buffer 46 are configured by a sharing mechanism, which utilize a multiplexer 42 represented by MUX to test a plurality of testkeys. Thus, in this mechanism that is capable of detecting the testkeys more effectively, the time consumed for the mechanical operation may be also reduced. Both the time cost and the circuit cost may be reduced in favor for the detection of a great amount of testkeys, and thus, the positions for deploying the testkeys may be more diversified to increase types of tests. The testkey detection circuit is specifically described below.

To view the testkey detection circuit in a broader manner, the testkey detection circuit includes a plurality of oscillators 20 and a shared driving circuit 40. Each of the oscillators 20 has an enable terminal EN, voltage terminals RO #1, RO #2 . . . corresponding to VCC1, VCC2 . . . and an output terminal. The enable terminals EN of the oscillators 20 are connected to a common enable terminal EN. The driving circuit 40 receives from a plurality of the output terminals of the oscillators 20. The driving circuit 40 increases a driving level of a selected one of the output terminals as a frequency output which is output by the output terminal OUT. Thus, the driving circuit 40 may test a plurality of testkeys, and the number of the testkeys is much more than the number of testkeys to be tested by the testkey detection circuit illustrated in FIG. 1, which may substantially increase the detection efficiency.

For further description, the oscillators 20 are, for example, ring oscillators having voltage terminals RO #1, RO #2 . . . and RO #12, and include 12 voltage terminals corresponding to 12 testkeys PAD1 #1, PAD #2 . . . and PAD #12, which respectively receive voltage signals VCC1, VCC2 . . . and VCC12 in an embodiment.

The driving circuit 40 includes the multiplexer 42 represented by MUX, the divider 44 and the buffer 46. The multiplexer 42 correspondingly receives outputs from the plurality of oscillators 20. One of selection signal terminals S0, S1, S2 and S3 of the multiplexer 42 may be sequentially selected for the output. The number of the selection signal terminals may be determined according to the number of input signals. The divider 44 may decrease a frequency of a frequency signal selected by the multiplexer 42 in favor for being read by an external applying analysis circuit. In order to achieve an obvious gradient change at a rising edge of the frequency signal the buffer 46 may be capable of increasing a driving level of the frequency signal output by the divider 44. In this way, for example, the rising edge of the signal may have a greater rising rate, so as to strengthen the quality of the frequency signal. The buffer 46 is formed by, for example, a plurality of cascading inverters. In this way, the frequency signal with the decreased frequency is output by the output terminal OUT. Moreover, the entire detection circuit uses a single ground terminal VSS and a single voltage terminal VCCB.

Figure 4:
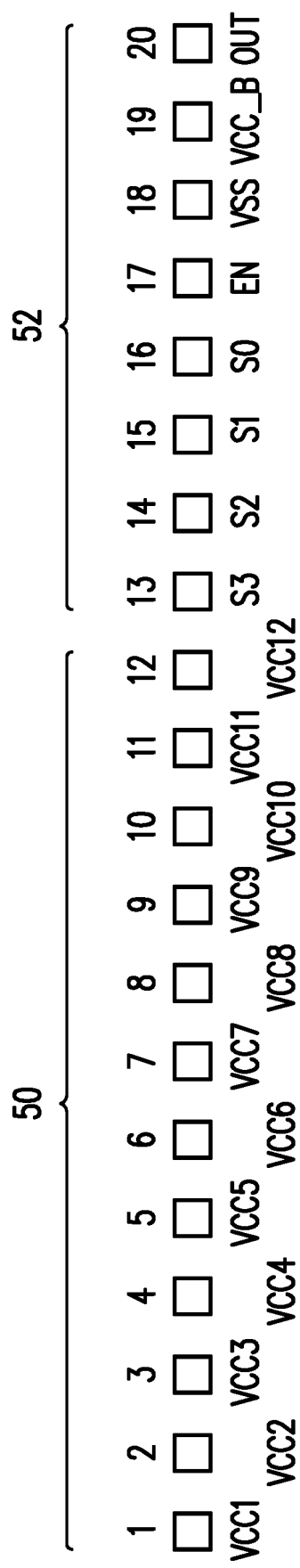
FIG. 4 is a schematic configuration diagram of circuit terminals used by the testkey detection circuit depicted in FIG. 1 according to an embodiment of the invention.

Taking the detection circuit including 20 probes for example, the difference generated between the circuits illustrated in FIG. 1 and in FIG. 3 is compared. FIG. 4 is a schematic configuration diagram of circuit terminals used by the testkey detection circuit depicted in FIG. 1 according to an embodiment of the invention. Referring to FIG. 4, taking the detection circuit including 20 probes for example, in the case of the circuit illustrated in FIG. 3, it includes two probe sets 50 and 52. The probe set 50 includes 12 probes configured to probe 12 voltage signals VCC1, VCC2 . . . and VCC12 corresponding to 12 testkeys and performs detection in correspondence to the configuration of the testkeys. The probe set 52 as the fixed terminals is commonly shared which include the selection signal terminals S0, S1, S2 and S3 of the multiplexer 42 and the sharing enable terminal EN, ground terminal VSS, voltage terminal VCCB and output terminal OUT. Thus, by comparing with this embodiment, the number of the terminals of the embodiment of FIG. 4 and the number of the terminals of the embodiment of FIG. 2 are both 20, however, the circuit illustrated in FIG. 3 may be capable of probing 12 testkeys, while the circuit illustrated in FIG. 1 is capable of testing 4 testkeys only. For the circuit illustrated in FIG. 3, the number of the probe sets 50 directly corresponding to the number of the testkeys, while the probe set 52 is shared and is not increased along with the increase of the testkeys. Regarding the circuit illustrated in FIG. 3, the number of the probes thereof is not limited to 20, namely, the number of the corresponding to the testkeys is not limited to 12 and is adjusted according to the configuration of the multiplexer 42.

The number of the testkeys may be increased as required within an acceptable range of the multiplexer 42, without causing any increase to the number of the probe set 52. The detection amount of the testkeys at a time may be substantially increased in the invention. For one detection, the number of chips to be tested at a time may be increased, thereby reducing the time spent for the mechanical operation, for example. For the test of a great amount of chips, the test time may be effectively saved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A testkey detection circuit, comprising:
    a plurality of oscillators, each of the oscillators having am enable terminal, a voltage terminal and an output terminal, wherein the enable terminals are connected to a common enable terminal; and
    a driving circuit, comprising:
        a multiplexer, receiving a plurality of frequency signals from a plurality of output terminals of the oscillators and outputting a selected one of the frequency signals;
        a divider, decreasing a frequency of the selected one of the frequency signals as a frequency-decreased signal; and
        a buffer, receiving the frequency-decreased signal to increase the driving level as a frequency output by increasing a rising rate at a rising edge of its output,
    wherein the driving circuit comprises a voltage source terminal to receive a voltage source different from the signal received by the voltage terminal to commonly provide the voltage source to the multiplexer, the divider and the buffer, and the testkey detection circuit is commonly grounded to a ground voltage.

2. The testkey detection circuit according to claim 1, wherein the multiplexer comprises a plurality of selection terminals to select the one of the frequency signals.

3. The testkey detection circuit according to claim 1, wherein the oscillators are ring oscillators.

4. The testkey detection circuit according to claim 1, wherein the multiplexer sequentially outputs the frequency signals according to a selection order, so as to sequentially obtain a plurality of the frequency outputs.

5. The testkey detection circuit according to claim 1, wherein the oscillators are respectively operated in different conditions.

6. The testkey detection circuit according to claim 1, wherein the voltage terminals of the oscillators provide different voltage sources.

7. The testkey detection circuit according to claim 1, wherein the voltage terminals of the oscillators respectively probe a plurality of contact pads at different circuit positions in integrated circuits.

8. The testkey detection circuit according to claim 1, wherein the oscillators are a plurality of ring oscillators, and the ring oscillators are identical circuits or circuits in which at least one of the ring oscillators is different from the others.

9. The testkey detection circuit according to claim 1, wherein the driving circuit comprises a single voltage input terminal to provide an operation voltage to the multiplexer, the divider and the buffer.

* * * * *